United States Patent
Colinge

(10) Patent No.: US 11,646,219 B2
(45) Date of Patent: May 9, 2023

(54) MANUFACTURING PROCESS OF A STRUCTURED SUBSTRATE

(71) Applicant: COMMISSARIAT A L'ENERGIE ATOMIQUE ET AUX ENERGIES ALTERNATIVES, Paris (FR)

(72) Inventor: Jean-Pierre Colinge, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/166,028

(22) Filed: Feb. 3, 2021

(65) Prior Publication Data

US 2021/0242071 A1 Aug. 5, 2021

(30) Foreign Application Priority Data

Feb. 4, 2020 (FR) ..................................... 20 01082

(51) Int. Cl.
*H01L 21/763* (2006.01)
*H01L 21/02* (2006.01)
(Continued)

(52) U.S. Cl.
CPC ........ *H01L 21/763* (2013.01); *H01L 21/0245* (2013.01); *H01L 21/02381* (2013.01); *H01L 21/02488* (2013.01); *H01L 21/02502* (2013.01); *H01L 21/02513* (2013.01); *H01L 21/02598* (2013.01); *H01L 21/02686* (2013.01); *H01L 21/76254* (2013.01); *H01L 21/0262* (2013.01); *H01L 21/02529* (2013.01);
(Continued)

(58) Field of Classification Search
None
See application file for complete search history.

(56) References Cited

U.S. PATENT DOCUMENTS

| 5,374,564 A | 12/1994 | Bruel |
| 5,773,151 A | 6/1998 | Begley et al. |
(Continued)

FOREIGN PATENT DOCUMENTS

| FR | 2 681 472 A1 | 3/1993 |
| WO | WO 2017/142704 A1 | 8/2017 |

OTHER PUBLICATIONS

French Preliminary Search Report dated Oct. 22, 2020 in French Application 20 01082 filed on Feb. 4, 2020 (with English Translation of Categories of Cited Documents), 2 pages.
(Continued)

*Primary Examiner* — Alexander G Ghyka
(74) *Attorney, Agent, or Firm* — Oblon, McClelland, Maier & Neustadt, L.L.P.

(57) ABSTRACT

A method for manufacturing a structured substrate provided with a trap-rich layer whereon rests a stack consisting of an insulating layer and of a layer of single-crystal material, includes forming an amorphous silicon layer on a front face of a silicon substrate and heat treating intended to convert the amorphous silicon layer into a trap-rich layer made of single-crystal silicon grains. The heat treatment conditions in terms of duration and of temperature are adjusted to limit the grains to a size less than 200 nm. The method also includes overlapping the trap-rich layer with an insulating layer and a layer of single-crystal material.

19 Claims, 4 Drawing Sheets

(51) Int. Cl.
*H01L 21/762* (2006.01)
*H01L 21/304* (2006.01)
*H01L 21/306* (2006.01)

(52) U.S. Cl.
CPC ...... *H01L 21/02532* (2013.01); *H01L 21/304* (2013.01); *H01L 21/30625* (2013.01)

(56) References Cited

U.S. PATENT DOCUMENTS

2004/0163585 A1* 8/2004 Park .................. H01L 29/6675
257/E21.412
2005/0079736 A1* 4/2005 Park .................. H01L 27/1285
257/E29.292

OTHER PUBLICATIONS

Nishikawa et al., "Electrical properties of polycrystalline silicon films formed from amorphous silicon films by flash lamp annealing", Current Applied Physics, vol. 11, issue 3, May 2011, pp. 604-607.
U.S. Appl. No. 16/184,346, filed Nov. 8, 2018, 2019/0148367 A1, Colinge, J, et al.
U.S. Appl. No. 16/723,285, filed Dec. 20, 2019, 2020/0203341 A1, Barraud, S, et al.
U.S. Appl. No. 16/854,968, filed Apr. 22, 2020, 2020/0343374 A1, Colinge, J, et al.
U.S. Appl. No. 16/902,873, filed Jun. 16, 2020, 2020/0395249 A1, Colinge, J.

\* cited by examiner

MANUFACTURING PROCESS OF A STRUCTURED SUBSTRATE

TECHNICAL FIELD

The invention relates to the field of substrates for micro-electronics and radiofrequency (RF). In particular, the present invention relates to the field of silicon on insulator (SOI) substrates, and particularly provided with a trap-rich layer inserted between a support substrate and a stack consisting of an insulating layer and of a silicon layer.

In this regard, the present invention aims to propose a method for manufacturing a HR SOI substrate for limiting the thickness of the trap-rich layer while maintaining a significantly high defect density in order to reduce, or even eliminate, parasitic phenomena likely to intervene at HR devices formed in or on said HR SOI substrate.

PRIOR ART

Silicon On Insulator (SOI) substrates are currently widely used, and have been for many years, for the manufacture of micro-electronic devices.

These substrates 1 comprise an insulating layer 3, inserted between a silicon layer 4 and a support substrate 2, intended to electrically insulate the components (particularly the transistors) of the same micro-electronic device (FIG. 1).

However as soon as this concerns manufacturing radiofrequency (hereafter "RF") devices, for example for mobile and particularly mobile telephony applications, this single insulating layer is no longer sufficient to ensure optimum operation of said devices. Indeed, the latter, when they operate, are the seat of parasitic phenomena that disrupt the operation thereof and de facto affect the performances thereof. From the parasitic phenomena likely to be observed, diaphonies, non-linearities, or also Eddy Currents are the most common.

In order to overcome this problem, it is proposed, in document U.S. Pat. No. 5,773,151, a new type of SOI substrate, known as RF SOI substrate, and wherein a trap-rich layer 3' is inserted between the insulating layer 3 and the support substrate 2. The trap-rich layer 3' comprises in this regard polycrystalline silicon. In other terms, the layer of polycrystalline silicon comprises grains of single-crystal silicon mutually connected by grain boundaries.

The efficiency of this trap-rich layer 3' to reduce, or even to eliminate, the parasitic phenomena is closely linked to the defect density thereof. More particularly, the higher the defect density, the better the efficiency of the trap-rich layer 3' to reduce the parasitic phenomena within a RF device.

In this regard it is known that said traps are essentially located at grain boundaries of the trap-rich layer 3', so that the density thereof reduces as the size of the grains forming the trap-rich layer 3' increases.

However, the methods currently implemented for the formation of polycrystalline silicon do not make it possible to form grains of a size less than approximately 1 µm. In other terms, the trap-rich layer in order to have an optimum efficiency must be of a thickness greater than 1 µm.

Nevertheless, the latter aspect is not satisfactory.

Indeed, the consideration of a trap-rich layer 3' of a thickness as significant is likely to generate stresses in the RF SOI substrate, and consequently affect the operation of the RF device or devices formed on or in said substrate.

Moreover, the RF SOI substrates seem to be prime candidates for the co-integration of digital and RF devices for example. Nevertheless, this co-integration requires arranging on the same substrate RF SOI zones, and solid silicon SiM zones such as shown in FIG. 3. The formation of these solid silicon SiM zones requires carrying out a localised etching of the stack formed by the silicon layer 4, the insulating layer 3, and the trap-rich layer 3', and of filling the void left vacant by epitaxial growth of single-crystal silicon.

Nevertheless, the consideration of a trap-rich layer of a thickness greater than 1 µm renders the execution of the etching and epitaxy steps delicate and long.

Thus, one aim of the present invention is to propose a method for manufacturing a SOI substrate provided with a trap-rich layer, and making it possible for the latter to be of a lower thickness whilst maintaining a sufficient defect density in order to eliminate the parasitic phenomena described above.

Another aim of the present invention is to propose a method for manufacturing a SOI substrate provided with a trap-rich layer that makes it possible for easier co-integration with regard to methods known from the prior art.

DESCRIPTION OF THE INVENTION

The aims of the invention are, at least in part, achieved by a method for manufacturing a substrate provided with a trap-rich layer whereon rests a stack consisting of, in the order and from said trap-rich layer, an insulating layer and of a layer of single-crystal material, the method comprising the following steps:

a) a step of forming an amorphous silicon layer that extends from a front face of a silicon substrate according to a thickness E less than 500 nm, advantageously between 50 nm and 200 nm, b) a step of heat treating intended to convert the amorphous silicon layer into a trap-rich layer consisting of single-crystal silicon grains mutually joined by grain boundaries and of a size less than 200 nm, preferably less than 100 nm, c) a step of forming a stack by overlapping the trap-rich layer, and consisting of, in the order and from said trap-rich layer, an insulating layer and of a layer of single-crystal material.

According to an embodiment, the heat treatment conditions of step b) in terms of duration and of temperature are adjusted in such a way as to limit the size T of the grains to a size less than 200 nm, preferably less than 100 nm.

According to an embodiment, step b) is executed by means of a laser radiation, advantageously the laser radiation is a pulse laser radiation whereof the pulses are of a duration between 1 nanosecond and 1 microsecond, of a fluence between 10 J/cm$^2$ and 300 J/cm$^2$, and of a wavelength between 200 nanometres and 1100 nanometres.

According to an embodiment, the amorphous silicon layer is formed, during step a), by deposition, and particularly by low pressure chemical vapour deposition.

According to an embodiment, the amorphous silicon layer is formed, during step a), by an amorphisation implantation, of amorphising species, intended to amorphise the silicon substrate from the front face thereof and according to an implantation depth equal to the thickness E.

According to an embodiment, the amorphising species comprise:

germanium ions, so that during step b) of heat treating germanium oxide forms at the grain boundaries, and/or carbon ions intended to also favour the formation of grains of size T less than 200 nm, preferably less than 100 nm, during the execution of step b), and/or species having a chemical affinity with silicon in such a way as to form with the latter precipitates or complexes aggregating at grain boundaries during the execution of step b), said species comprising in particular oxygen ions and/or nitrogen ions.

According to one embodiment, step b) is preceded by a step a3) of flattening the amorphous silicon layer, step a3) advantageously being executed by mechano-chemical planarization.

According to an embodiment, during the execution of step c), the formation of the layer of single-crystal material comprises a transfer of said layer of single-crystal material from a donor substrate.

According to an embodiment, the transfer comprises in the following steps order:
assembling the donor substrate and of the single-crystal silicon substrate, and
thinning the donor substrate in such a way as to only maintain the layer of crystal material on the single-crystal silicon substrate.

According to an embodiment, the thinning of the donor substrate comprises a mechanical abrasion thinning.

According to an embodiment, the assembling of the donor substrate and of the silicon substrate is preceded by the formation of an embrittlement area that delimits the layer of single-crystal material within the donor substrate, advantageously the embrittlement area is formed by implantation of chemical species, and particularly by implantation of hydrogen and/or of helium.

According to an embodiment, the thinning comprises a fracture that propagates along the embrittlement area, said fracture advantageously being initiated by a second heat treatment.

According to an embodiment, the assembling is preceded by the formation of the insulating layer on one and/or other of the trap-rich layer and of the layer of single-crystal material.

According to an embodiment, the layer of single-crystal material comprises at least one of the elements selected from: silicon, germanium, silicon-germanium alloy, silicon carbide, a lil-V semi-conductor, a piezoelectric material.

The invention also relates to a structured substrate that comprises:
a trap-rich layer that extends from a front face of a silicon substrate according to a thickness E less than 500 nm, advantageously between 50 nm and 200 nm, the trap-rich layer comprising single-crystal silicon grains mutually joined by grain boundaries, and of a size T less than 200 nm, or even 100 nm, and
a stack consisting of, in the order and from said trap-rich layer, an insulating layer and of a layer of single-crystal material.

BRIEF DESCRIPTION OF THE DRAWINGS

Other features and advantages will become apparent in the following description of a method for manufacturing a structured substrate according to the invention, given by way of non-limiting examples, with reference to the appended drawings wherein.

DETAILED DESCRIPTION OF SPECIFIC EMBODIMENTS

The present application relates to a method for manufacturing a structured substrate, and particularly a substrate that comprises from a front face towards a rear face, a layer of single-crystal material, an insulating layer, a trap-rich layer, and a support substrate.

In particular, the method according to the present invention makes it possible to form a trap-rich layer consisting of single-crystal silicon grains mutually joined by grain boundaries, and where of the size T is less than 200 nm, or even 100 nm.

To this end, the method implements the formation of an amorphous silicon layer that is converted into the trap-rich layer by execution of a thermal annealing in appropriate conditions in terms of duration and of temperature. The advantageous combination of these two conditions then makes it possible to form a trap-rich layer of a relatively low thickness, and particularly less than 500 nm, while having a relatively high defect density.

Figure 1:
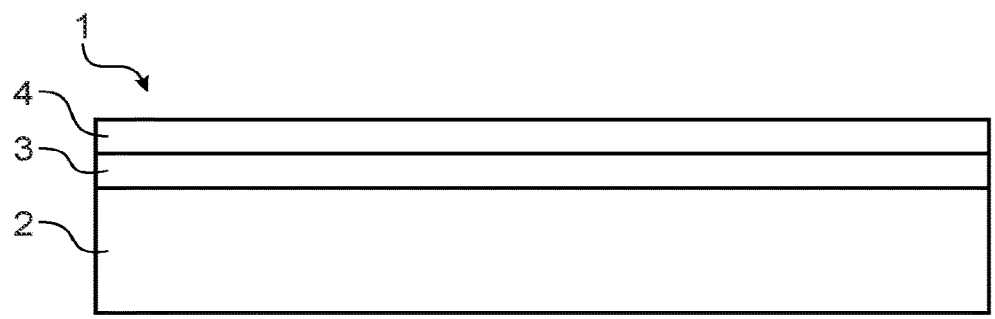
FIG. 1 is a schematic representation of a SOI substrate known from the prior art and devoid of trap-rich layer, the SOI substrate being particularly shown according to a sectional plane perpendicular to a main face of said SOI substrate.
Figure 2:
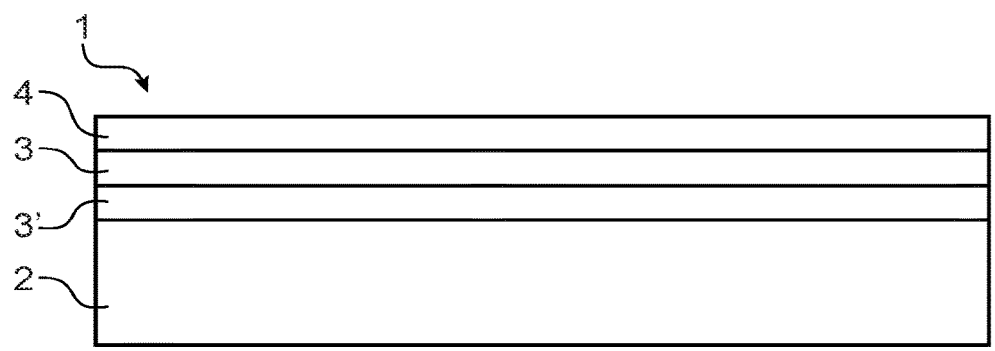
FIG. 2 is a schematic representation of a RF SOI substrate from the prior art and provided with a trap-rich layer inserted between the insulating layer and the support substrate, the RF SOI substrate being particularly shown according to a sectional plane perpendicular to a main face of said SOI substrate.
Figure 3:
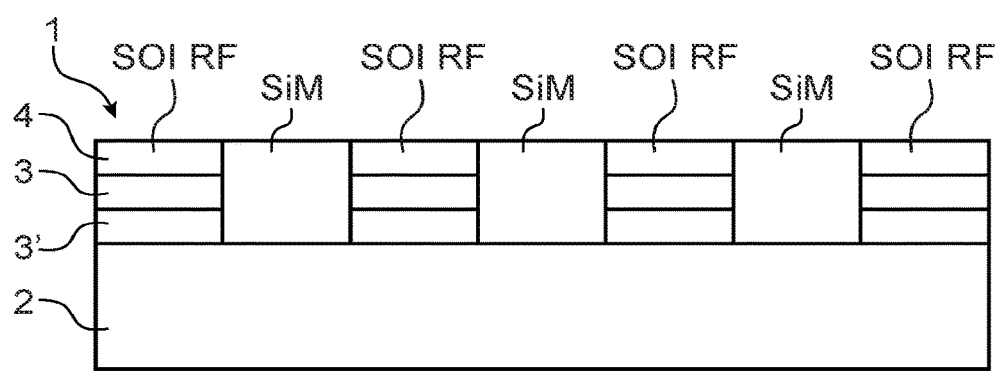
FIG. 3 is a schematic representation of the RF SOI substrate of FIG. 2, and whereon solid silicon zones have been formed.
Figure 4:
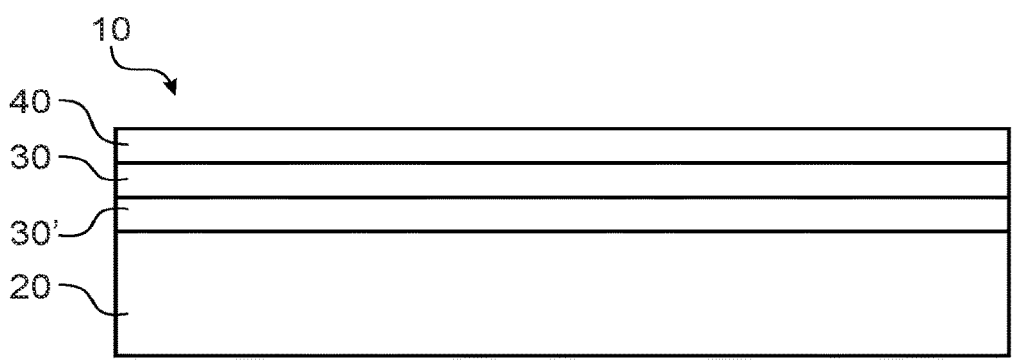
FIG. 4 is a schematic representation of a structured substrate obtained by the manufacturing method according to the present invention, the structured substrate being particularly shown according to a sectional plane perpendicular to said substrate.

In FIG. 4, it can be seen a schematic representation of a structured substrate 10 according to the present invention.

The structure substrate 10 particularly comprises:
- a trap-rich layer 30' that extends from a front face of a silicon substrate 20 according to a thickness E less than 500 nm, advantageously between 50 nm and 200 nm, the trap-rich layer 30' comprising single-crystal silicon grains mutually joined by grain boundaries, and of a size T less than 200 nm, or even 100 nm, and
- a stack consisting of, in the order and from said trap-rich layer, an insulating layer 30 and of a layer of single-crystal material 40.

FIGS. 5 to 13 are schematic representations of various steps likely to be implemented for manufacturing a structured substrate 10 according to the present invention.

The manufacturing method comprises a step a) of forming an amorphous silicon layer 25. In particular, the amorphous silicon layer 25 is formed in or on a silicon substrate 20, and extends from a front face 21 of said silicon substrate.

More particularly, the amorphous silicon layer 25 has a thickness E less than 500 nm, or even between 50 nm and 200 nm, for example equal to 100 nm.

Figure 5:
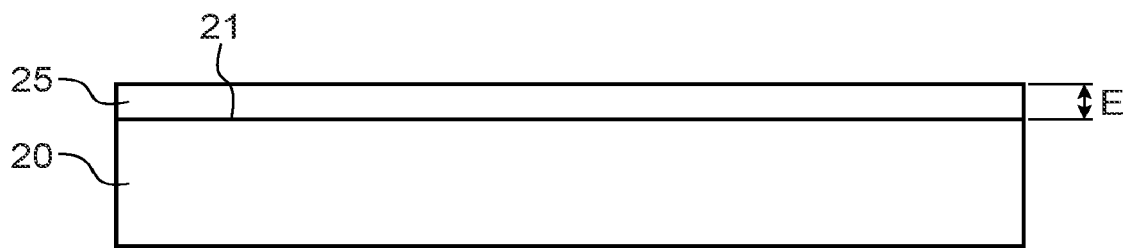
FIG. 5 is a schematic representation of the execution of step a) according to a first alternative of the present invention, the single-crystal silicon substrate being shown according to a sectional plane perpendicular to the front face of said substrate.

Such as illustrated in FIG. 5, and according to a first variant, the amorphous silicon layer 25 may be formed by deposition, and particularly by Low Pressure Chemical Vapour Deposition (LPCVD), directly on the front face 21 of the silicon substrate.

The LPCVD may particularly implement silane as precursor, and be executed at a temperature between 480° C. and 600° C.

Figure 6:
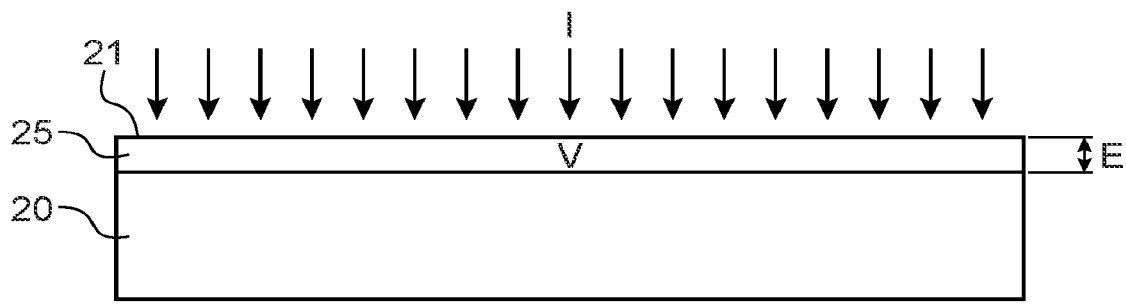
FIG. 6 is a schematic representation of the execution of step a) according to a second alternative of the present invention, the single-crystal silicon substrate being shown according to a sectional plane perpendicular to the front face of said substrate.
Figure 7:
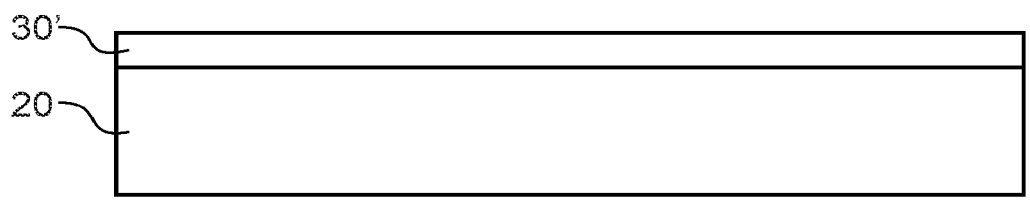
FIG. 7 is a schematic representation of the execution of step b) according to the present invention, the crystalline silicon substrate being shown according to a sectional plane perpendicular to the front face of said substrate.

According to a second alternative, illustrated in FIG. 6, the amorphous silicon layer may be formed in a volume V of silicon substrate 20 that extends, from the front face 21, according to a depth equal to the thickness E.

This second alternative may particularly implement an implantation I, known as amorphisation implantation, of amorphising species in such a way as to amorphise the volume V of the silicon substrate 20.

The species implanted during the implantation I may particularly comprise germanium ions or silicon ions.

Nevertheless, the invention is not limited to these species only, and the person skilled in the art may select any other ion likely to be suitable for the implementation of this amorphisation step.

By way of example, the implantation may implement an implantation of germanium ions whereof the dose is between $10^{16}$ cm$^{-2}$ and $10^{17}$ cm$^{-2}$, and the implantation depth is between 50 nm and 500 nm. The implantation of germanium may also be executed in a plurality of steps, at different energies and implantation doses, in such a way as to spread out the implanted zone.

Alternatively or additionally, the amorphising species may comprise carbon ions.

Still alternatively and/or additionally, the amorphising species may comprise species having a chemical affinity with silicon, in such a way as to form with the latter precipitates or complexes, and particularly precipitates or complexes aggregating at grain boundaries during the execution of a recrystallisation by heat treatment of the amorphous silicon layer 25.

Step a) of the method for manufacturing a structured substrate is then followed by a step b) (FIG. 7) of heat treating intended to recrystallise the amorphous silicon layer and thus convert it into a trap-rich layer 30' consisting of single-crystal silicon grains mutually joined by grain boundaries. The heat treatment conditions in terms of duration and of temperature are adjusted to limit the size T of the grains to a size less than 200 nm, or even 100 nm. This treatment may use an annealing known as "Flash", and particularly implement a laser device that may within a very short period of time locally heat the amorphous silicon in such a way as to transform it into polycrystalline silicon. The "Flash" annealing may be carried out by the use of a flash lamp heating system (duration: a few milliseconds), or by a "nanosecond" laser annealing (duration between 1 ns and 1 μs). The execution speed of such a localised heating favours the formation of single-crystal grains that are much smaller than those obtained by conventional annealing techniques such as rapid thermal annealing (RTA).

By way of example, step b) implements a laser radiation whereof the pulses are of a duration between 1 nanosecond and 1 microsecond, of a fluence between 10 i/cm$^2$ and 300 J/cm$^2$, and of a wavelength between 200 nanometres and 1100 nanometres.

The laser used for this type of annealing may be a pulse laser, particularly an excimer laser of the KrF type. An Nd:YAG laser can also be used whereof the wavelength is 1.06 μm. The person skilled in the art desiring to implement a step b) with a Laser device may consult document [1] cited at the end of the description.

Moreover, it is notable that a step a) executed according to the second alternative by amorphisation implantation of germanium ions will have a particularly advantageous effect during the execution of step b) of heat treatment. Indeed, the germanium ions likely to be implanted will form, during the execution of step b), germanium oxide that favours the formation of small grains. Furthermore, the germanium oxide formed during the execution of step b) concentrates at grain boundaries and consequently freezes the growth of the latter.

An amorphisation implantation implementing carbon ions also makes it possible to favour the formation of grains of size T less than 200 nm, preferably less than 100 nm, during the execution of step b). The dose of implanted carbon ions may for example be between $10^4$ cm$^{-2}$ and $10^6$ cm$^{-2}$ and at an energy between 15 keV and 150 keV.

An amorphising implantation implementing species having a chemical affinity with silicon, will make it possible to form with the latter precipitates or complexes, and particularly precipitates or complexes aggregating at grain boundaries during the execution of step b).

This last aspect is also extremely advantageous in so far as precipitates and/or complexes will concentrate at grain boundaries during the execution of step b) and thus increase the defect density. In other terms this implantation makes it possible to improve the trapping capacity of the trap-rich layer 30'. Prime species are for example oxygen ions and/or nitrogen ions. The dose of these implanted species may for example be between $10^{14}$ cm$^2$ and $10^{16}$ cm$^{-2}$ and at an energy between 15 keV and 150 keV.

Step b) of heat treating may be followed directly by a step b1) of Chemical Mechanical Polishing (CMP). This CMP step may particularly be implemented in order to prepare (smooth) the exposed surface of the trap-rich layer 30' before an assembling step that will be presented in the remainder of the statement of the present invention.

Finally, the method according to the present invention comprises a step c) of forming a stack by overlapping the trap-rich layer 30', and consisting of, in the order and from said trap-rich layer 30', an insulating layer 30 and of a layer of single-crystal material 40.

The layer of single-crystal material may comprise at least one of the elements selected from: silicon, germanium, silicon-germanium alloy, silicon carbide, a Ill-V semi-conductor, and a piezoelectric material.

Step c) may particularly comprise a transfer of said layer of single-crystal material from a donor substrate 50.

More particularly, and according to a particularly advantageous embodiment, step c) comprises the transfer of the stack formed by the insulating layer 30 and the layer of single-crystal material 40 from the donor substrate 50.

Figure 8:
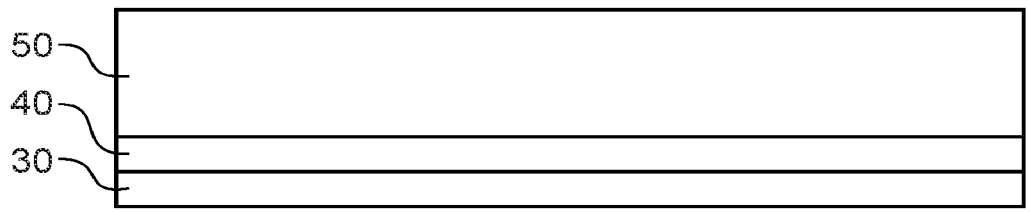
FIG. 8 is a schematic representation of a donor substrate on a main face of which rests in the order the layer of single-crystal material and the insulating layer.
Figure 9:
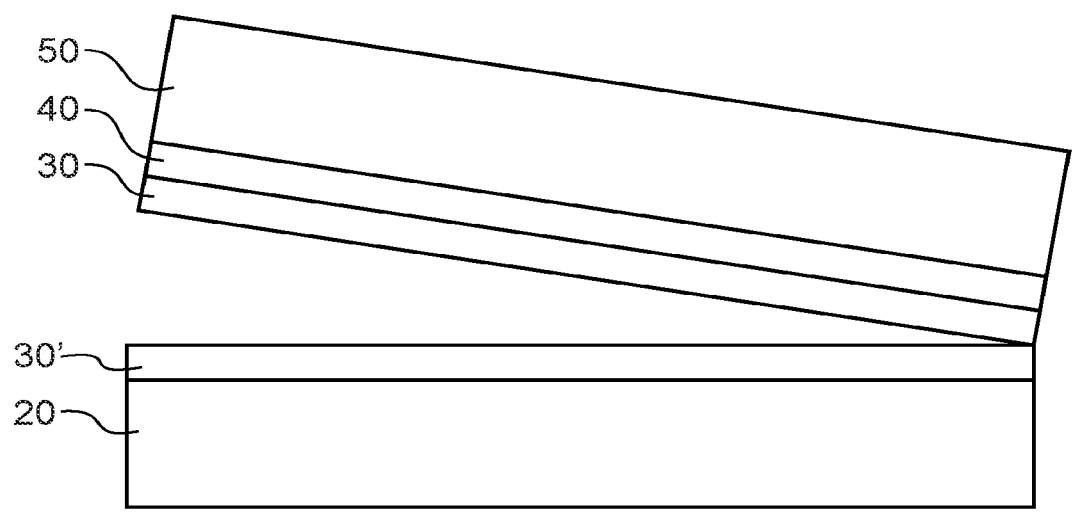
FIG. 9 is a schematic representation of an assembling step executed during the transfer of a layer of single-crystal material and of an insulating layer likely to be implemented within the scope of the present invention.

In other terms the insulating layer 30 may be formed by overlapping the layer of single-crystal material 40 formed on or in the donor substrate 50 (FIG. 8).

For example, the insulating layer 30 comprises silicon oxide, for example deposited according to a conventional deposition technique. In this regard, it may concern a silicon layer formed by Plasma Enhanced Chemical Vapour Deposition (PECVD), and implementing TEOS as precursor. Alternatively, if the donor substrate is a single-crystal silicon substrate, the insulating layer may be obtained by thermal oxidation of the latter.

Figure 10:
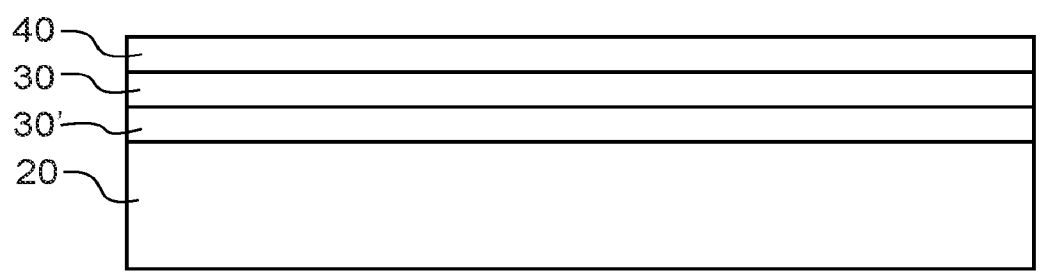
FIG. 10 is a schematic representation of a thinning step executed during the transfer of a layer of single-crystal material and of an insulating layer likely to be implemented within the scope of the present invention.

Thus, according to these conditions, the transfer of the stack may comprise the following steps:

assembling the donor substrate 50 and of the single-crystal silicon substrate 20 (FIG. 9), by bringing the insulating layer 30 and the trap-rich layer 30' into contact, and thinning the donor substrate in such a way as to only maintain the layer of crystal material on the single-crystal silicon substrate (FIG. 10).

The thinning may comprise a Mechanical Grinding or Chemical Mechanical Polishing (CMP).

The transfer may, alternatively, involve the method known as "SmartCut®" and described in document FR 2681472.

Figure 11:
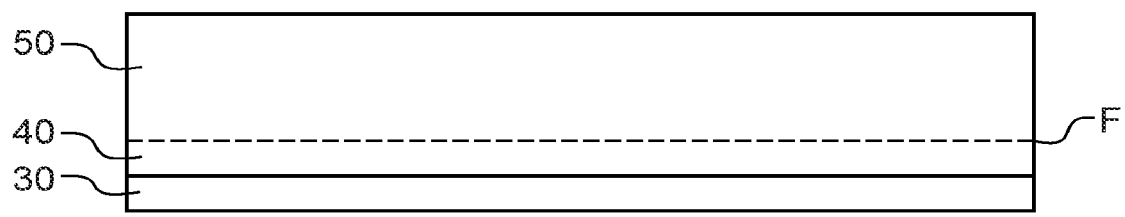
FIG. 11 is a schematic representation of a step of forming an embrittlement area executed for the transfer of a layer of single-crystal material and of an insulating layer, and likely to be implemented within the scope of the present invention.

In particular, the assembling may be preceded by the formation of an embrittlement area F that delimits the layer of single-crystal material 40 within the donor substrate 40 (FIG. 11). In a particularly advantageous manner, the embrittlement area F is formed by chemical species implantation, and particularly by hydrogen implantation.

According to these conditions, the thinning may comprise a fracture that propagates along the embrittlement area F. In a particularly advantageous manner, the facture may be initiated by a second heat treatment.

However, the invention is not limited only to the formation of the insulating layer 30 by overlapping the layer of single-crystal material before the transfer step.

Figure 12:
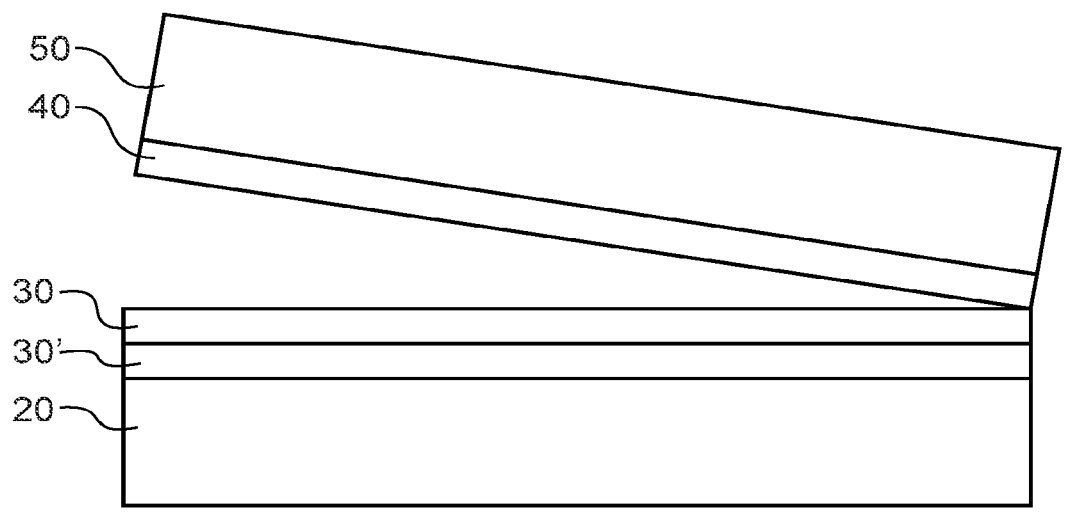
FIG. 12 is a schematic representation of an assembling step considering the insulating layer formed by overlapping the trap-rich layer before said assembling and likely to be implemented within the scope of the present invention.

Indeed, and alternatively, the insulating layer 30 may be formed by overlapping the trap-rich layer 30' before the assembling. In these conditions, and such as illustrated in FIG. 12, the assembling the donor substrate 50 and of the single-crystal silicon substrate comprises bringing the insulating layer 30 into contact with the layer of single-crystal material 40.

Figure 13:
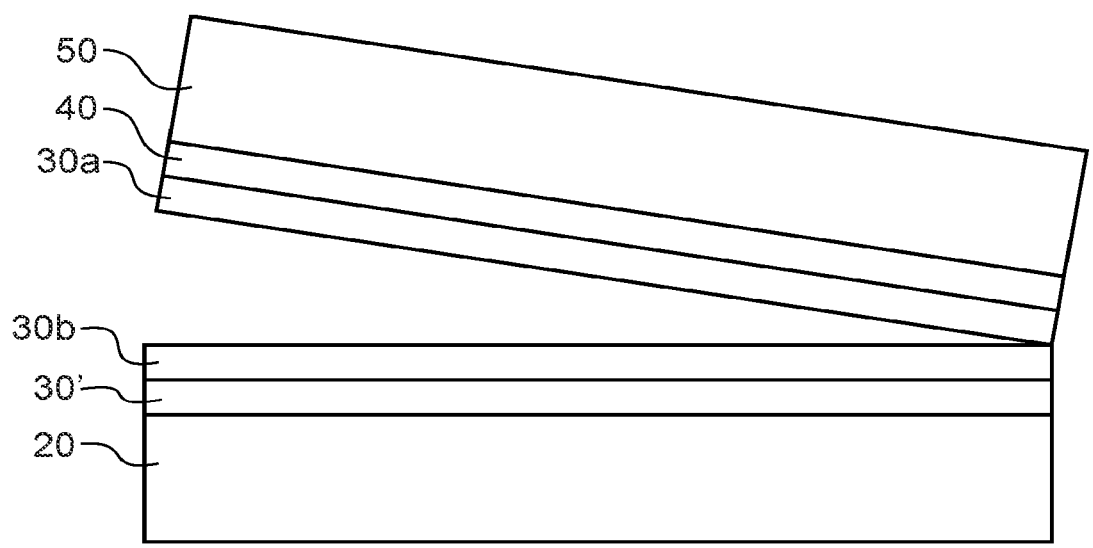
FIG. 13 is a schematic representation of an assembling step considering the insulating layer comprising a stack provided with a first insulating layer and with a second insulating layer formed by overlapping, respectively, of the layer of single-crystal material and of the trap-rich layer before said assembling and likely to be implemented within the scope of the present invention.

Alternatively, the insulating layer 30 may comprise a stack of a first insulating layer 30a and of a second insulating layer 30b formed by overlapping, respectively, of the layer of single-crystal material 40 and of the trap-rich layer 30' before assembling. In these conditions, and such as illustrated in FIG. 13, the assembling of the donor substrate 50 and of the single-crystal silicon substrate 20 comprises bringing the first insulating layer 30a and the second insulating layer 30b into contact.

It is understood that all aspects and alternatives presented in the present invention may be combined together.

The invention thus described makes it possible to consider structured substrates provided with a trap-rich layer with higher defect density. Thus, this aspect makes it possible to reduce the thickness of the trap-rich layer.

Such a method is then advantageously implemented for manufacturing a structured substrate of the HR SOI type intended for RF applications, and more particularly for the co-integration of RF devices and of logic components.

REFERENCES

[1] TakuyaNishikawa et al., "*Electrical properties of polycrystalline silicon films formed from amorphous silicon films by flash lamp annealing*", Current Applied Physics, Vol. 11, issue 3, pages 604-607, May 2011.

The invention claimed is:

1. A method for fabricating a structured substrate provided with a trap-rich layer whereon rests a stack consisting of, in the following order and from said trap-rich layer: an insulating layer and a layer of single-crystal material, the method comprising the following steps:
   a) forming an amorphous silicon layer that extends from a front face of a silicon substrate according to a thickness less than 500 nm,
   b) heat treating to convert the amorphous silicon layer into a trap-rich layer consisting of single-crystal silicon grains mutually joined by grain boundaries and of a size less than 200 nm, and
   c) forming the stack by overlapping the trap-rich layer, and consisting of, in the order and from said trap-rich layer, an insulating layer and a layer of single-crystal material,
   wherein step b) is executed using a laser radiation, the laser radiation being a pulse laser radiation whereof the pulses are of a duration between 1 ns and 1 µs, of a fluence between 10 J/cm$^2$ and 300 J/cm$^2$, and of a wavelength between 200 nm and 1100 nm.

2. The method according to claim 1, wherein heat treatment conditions of step b) in terms of duration and of temperature are adjusted in such a way as to limit a size of the grains to a size less than 200 nm.

3. The method according to claim 1, wherein the amorphous silicon layer is formed, during step a), by an amorphisation implantation, of amorphising species, configured to amorphise the silicon substrate from the front face thereof and according to an implantation depth equal to the thickness.

4. The method according to claim 3, wherein the amorphising species comprise at least one of:
   germanium ions, so that during step b) of heat treating germanium oxide forms at the grain boundaries,
   carbon ions configured to form grains of size less than 200 nm, during execution of step b), and
   species having a chemical affinity with silicon in such a way as to form with silicon precipitates or complexes aggregating at grain boundaries during the execution of step b).

5. The method according to claim 1, wherein step c) is preceded by a step a3) of flattening the amorphous silicon layer, step a3) being executed by mechano-chemical polishing.

6. The method according to claim 1, wherein, during execution of step c), formation of the layer of single-crystal material comprises a transfer of the layer of single-crystal material from a donor substrate.

7. The method according to claim 6, wherein the transfer comprises in an order of:
assembling the donor substrate and the silicon substrate, and
thinning the donor substrate in such a way as to only maintain the layer of crystal material on the silicon substrate.

8. The method according to claim 7, wherein the thinning of the donor substrate comprises a mechanical abrasion thinning.

9. The method according to claim 8, wherein the assembling of the donor substrate and the silicon substrate is preceded by formation of an embrittlement area that delimits the layer of single-crystal material within the donor substrate, the embrittlement area being formed by implantation of a chemical species.

10. The method according to claim 9, wherein the thinning comprises a fracture that propagates along the embrittlement area, said fracture being initiated by a second heat treatment.

11. The method according to claim 7, wherein the assembling is preceded by formation of the insulating layer on at least one of the trap-rich layer and the layer of single-crystal material.

12. The method according to claim 1, wherein the layer of single-crystal material comprises at least one of elements selected from: silicon, germanium, silicon-germanium alloy, silicon carbide, a Ill-V semi-conductor, and a piezoelectric material.

13. The method according to claim 1, comprising forming an amorphous silicon layer that extends from a front face of a silicon substrate according to the thickness between 50 nm and 200 nm.

14. The method according to claim 1, wherein the grains are of a size less than 100 nm.

15. The method according to claim 9, wherein the chemical species comprises at least one of hydrogen and helium.

16. A structured substrate fabricated by the method of claim 1, comprising the trap-rich layer extending from the front face of the silicon substrate and having a thickness less than 500 nm.

17. A method for fabricating a structured substrate provided with a trap-rich layer whereon rests a stack consisting of, in the following order and from said trap-rich layer: an insulating layer and a layer of single-crystal material, the method comprising the following steps:
a) forming an amorphous silicon layer that extends from a front face of a silicon substrate according to a thickness less than 500 nm,
b) heat treating to convert the amorphous silicon layer into a trap-rich layer consisting of single-crystal silicon grains mutually joined by grain boundaries and of a size less than 200 nm, and
c) forming the stack by overlapping the trap-rich layer, and consisting of, in the order and from said trap-rich layer, an insulating layer and a layer of single-crystal material,
wherein the amorphous silicon layer is formed, during step a), by an amorphisation implantation, of amorphising species, configured to amorphise the silicon substrate from the front face thereof and according to an implantation depth equal to the thickness.

18. The method according to claim 17, wherein the amorphising species comprise at least one of:
germanium ions, so that during step b) of heat treating germanium oxide forms at the grain boundaries,
carbon ions configured to form grains of size less than 200 nm, during execution of step b), and
species having a chemical affinity with silicon in such a way as to form with silicon precipitates or complexes aggregating at grain boundaries during the execution of step b).

19. The method according to claim 17, wherein the grains are of a size less than 100 nm.

* * * * *